United States Patent
Su et al.

[11] Patent Number: 6,037,604
[45] Date of Patent: Mar. 14, 2000

[54] TWO-MODE INGASB/GASB STRAINED-LAYER SUPERLATTICE INFRARED PHOTODETECTOR

[75] Inventors: Yan-Kuin Su, Tainan; Shi-Ming Chen, I-Lan, both of Taiwan

[73] Assignee: National Science Council, Taipei, Taiwan

[21] Appl. No.: 08/298,343

[22] Filed: Aug. 30, 1994

[51] Int. Cl.$^7$ ...................................... H01L 29/06
[52] U.S. Cl. .......................... 257/17; 257/18; 257/21; 257/22
[58] Field of Search ................... 257/18, 21, 17, 257/22

[56] References Cited

U.S. PATENT DOCUMENTS 4,607,272  8/1986  Osbourn ..................................... 257/18
4,806,993  2/1989  Voisin et al. .......................... 257/21 X

OTHER PUBLICATIONS

Chen et al., "Two–Mode InGaSb/GaSb Strained–Layer Superlattice Infrared Photodetector", *IEEE Electron Device Letter*, vol. 14, No. 9, Sep. 1993, pp. 447–449.
Kurtz et al., "Extended Infrared Response of InAsSb Strained–Layer Superlattices", *Appl. Phys. Lett.* 52(10), Mar. 7, 1988, pp. 831–833.
Hodgge et al., "NIPI Superlattices in InSb:An Alternative Route to 10$\mu$m Detector Fabrication," *Semicond. Sci. Technol.* 5(1990) pp. 5319–5322.
Kurtz et al., "Demonstration of an InAsSb Strained–Layer Superlattice Photodiode," *Appl. Phys. Lett.* 52(19), May 9, 1988, pp. 1581–1583.
Kurtz et al., "High–Detectivity ($>1\times10^{10}$cm $\sqrt{H_g}$/W), InAsSb Strained–Layer Superlattice, Photovoltaic Infrared Detector," *IEEE Electron Device Letters*, vol. 11, No. 1, Jan. 1990, pp. 54–56.
Lin et al., "Magneto Optics of Two–Dimensional Holes in a Strained–Layer InAs$_{0.15}$Sb$_{0.85}$/InSb Superlattice," *Appl. Phys. Lett.* 57(10), Sep. 3, 1990, pp. 1015–1017.

*Primary Examiner*—Tom Thomas
*Attorney, Agent, or Firm*—Townsend and Townsend and Crew LLP

[57] ABSTRACT

A InGaSb/GaSb strained-layer superlattices infrared photodetector in which the light-hole and heavy-hole are dispersed by the stress of the lattice mismatch, making the confined energy of the light hole and that of the heavy hole different. The wave function coupling of 1C-1HH is larger at near zero bias, thus the 1C-1HH is dominant. The wave function coupling of 1C-1LH is increased as reverse bias increases. When the reverse bias is high enough, the 1C-1HH transition becomes dominant. Because the transition energy of 1C-1HH and that of 1C-1LH are different, the modes of photodetector can be modulated by applying voltage.

5 Claims, 3 Drawing Sheets

TWO-MODE INGASB/GASB STRAINED-LAYER SUPERLATTICE INFRARED PHOTODETECTOR

BACKGROUND

The present invention relates generally to a photo-detector, and more particularly to a two-mode InGaSb/GaSb strained-layer superlattice infrared photodetector.

At present, such general photodetectors as quantum well and superlattice photodetectors yield specific frequencies for specific amounts of energy. They use the transition between the lowest confined energy band of electrons(1C) and the highest confined energy band of a heavy hole (1HH) to produce a photoelectric current; therefore they cannot function as two-mode photodetectors. In order for a prior art photodetector to select between two different wavelengths, the prior art detector usually must be adapted to include two photodetectors and two filters. In addition, prior art tricolor photodetectors use a SiC:H/a-Si:H heterojunction and employ different active areas to absorb the light of different wavelengths: 575 nm, 530 nm, and 480 nm, all within the range of visible light only.

SUMMARY OF THE INVENTION

In view of the shortcomings described above, it is an object of this invention to provide a photo-detector of novel design which absorbs the light of different wavelengths by applying bias voltage, wherein the absorbed wavelengths are within the range of infrared, and are therefore of great value in the fields of night vision and in communication systems.

This invention utilizes the strain in a strained-layer superlattice to separate the heavy hole from the light hole to provide a different confined energy and different transition energy when biased by an external voltage. Technically when the bias voltage is nearly zero, the peak response energy of the photoelectric current is about equal to the transition energy of 1C (the lowest confined energy of the electrons) to 1HH (the highest confined energy of the heavy hole), because the wave function coupling of 1C and 1HH is optimal. On the other hand, when reverse bias is increased, the wave function coupling of 1C and 1LH (the highest confined energy of the light hole) increases too. Hence, when the reverse bias is high enough that the degree of coupling between 1C and 1LH is greater than the degree of coupling between 1C and 1HH, the dominant light absorption becomes the transition between 1C and 1HH. Furthermore, because the transition between 1C and 1HH is different from the transition between 1C and 1LH, the absorption of different wavelengths is affected by extraneous bias voltage.

BRIEF DESCRIPTION OF THE DRAWINGS

The present invention can be more fully understood by reference to the following detailed description and accompanying drawings, which form the integral part of this application, wherein.

DESCRIPTION OF THE PREFERRED EMBODIMENT

Figure 1:
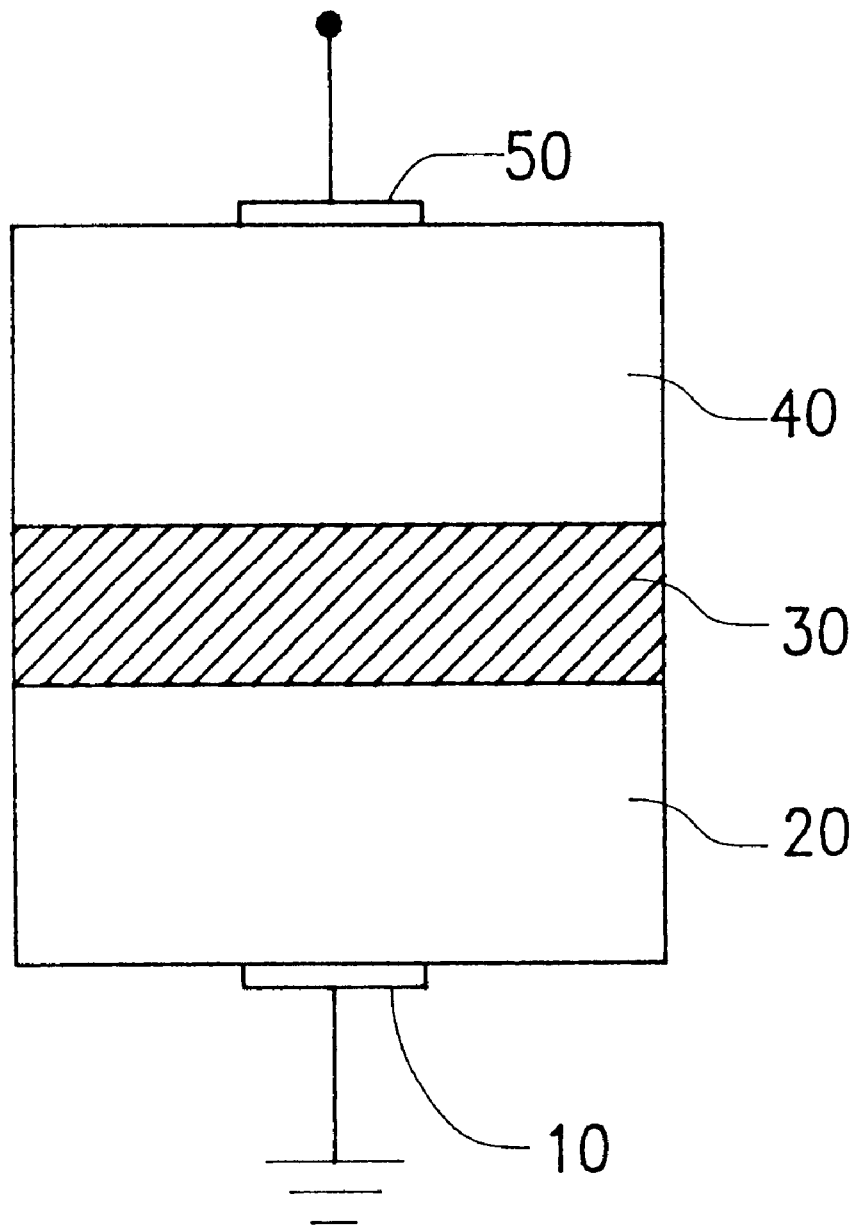
FIG. 1 is a cross-sectional structure of the detector of this invention.

Referring to FIG. 1, the two-mode InGaSb strained-layer superlattice photodetector includes: an N-type ohmic contact 10; an N-type GaSb substrate 20; a plurality of intrinsic InGaSb/GaSb strained-layer superlattices 30; a P-type GaSb layer 40; and a P-type ohmic contact 50. To develop the infrastructure, a process called MOCVD (Metal Organic Chemical Vapor Deposition) is used that includes steps of:

(1) depositing a plurality of intrinsic InGaSb/GaSb strained-layer superlattices 30 on an N-type GaSb substrate 20 using about 10 periods superlattices, InGaSb layer being about 130 Å thick; and GaSb layers being about 150 Å thick; (2) depositing a P-type GaSb layer 40 on said plurality of InGaSb/GaSb strained-layer superlattices 30; (3) using an evaporation method to form a P-type ohmic contact (composed of Au and Zn) 50 on said P-type GaSb layer 40, and (4) forming on said N-type GaSb substrate, by evaporation, an N-type ohmic contact 10 composed of Au, Ge and Ni, the depositing method for said plurality of InGaSb/GaSb strained-layer superlattices being MOCVD, which requires the following conditions:

temperature $\approx 500°$, pressure $\approx 150$ torr, flux ratio (TMSb+TEGa+TMIn)/$H_2 \approx 10^{-4}$, where In=19% of III-valence alloy family group Ga=81% of III-valence alloy family group.

Figure 2A:
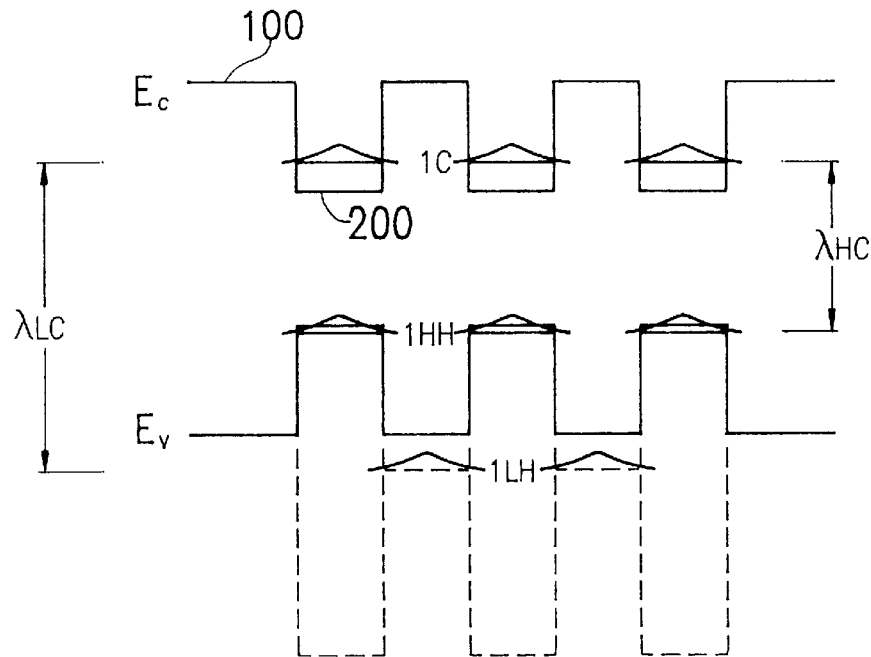
FIG. 2a is an energy band diagram at near zero bias according to this invention.
Figure 2B:
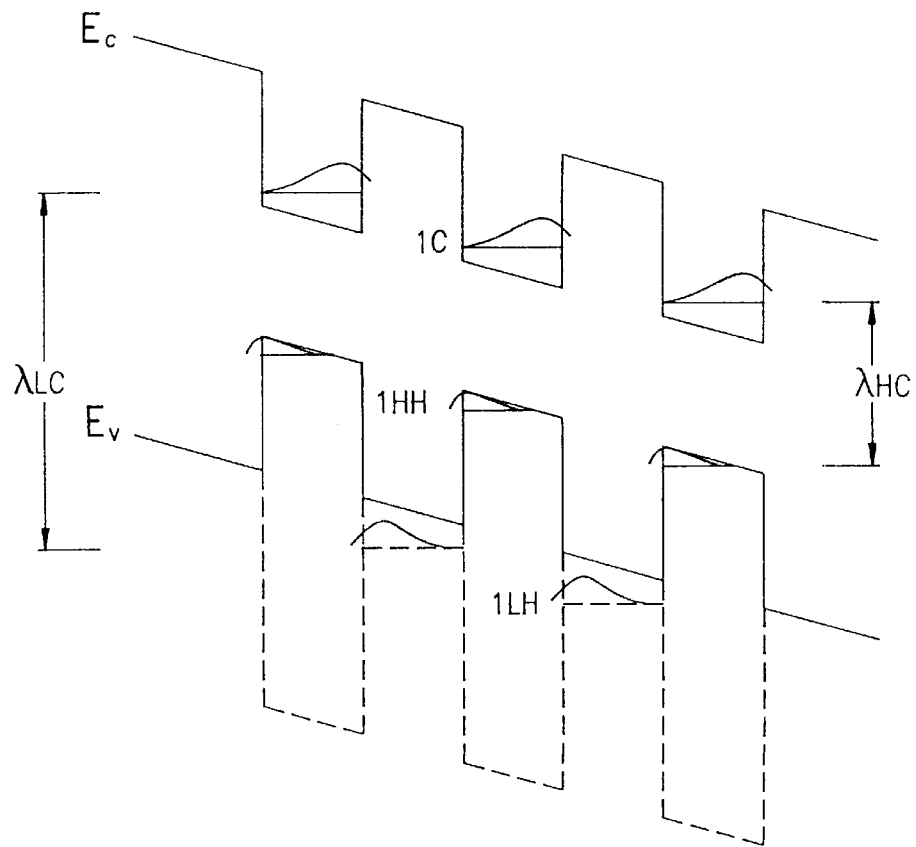
FIG. 2b is an energy band diagram at reverse bias according to this invention.

In the structure thus obtained, a strain is produced between the layers because the InGaSb lattices and the GaSb lattices in the plurality of InGaSb/GaSb layers are not compatible. As a result, the light hole and the heavy hole are separated. Referring to FIG. 2a which is a diagram of an energy band, the strain within the InGaSb layer produces confined energy bands of electrons such as 1C, 2C . . . etc. and heavy hole energy bands such as 1HH, 2HH . . . etc.(200). The light holes in the InGaSb layer form an energy barrier of the adjacent unstrained GaSb layer, creating the light hole energy bands 1LH, 2LH . . . etc (100). Therefore, within the strained-layer superlattice structure the confined energy bands such as 1HH, 2HH, . . . etc. and 1LH, 2LH . . . etc. may be formed in different layers (InGaSb Layer). Moreover, the transition energy of 1C to 1HH is different from the transition energy of 1C to 1LH, and the dominant transition is determined by wave function coupling of two bands. At near zero bias, wave function coupling of 1C and 1HH is optimal, and therefore the dominant transition occurs between 1C and 1HH. The absorbed wavelength is 1.93 $\mu$m. On the other hand, the wave function coupling between 1C and 1LH increases as reverse bias increases. When the reverse bias is high enough that the coupling of 1C and 1LH is larger than the coupling of 1C and 1HH, dominant light absorption shifts from 1C/1HH to 1C/1LH, and the absorbed wavelength is 1.77 $\mu$m.

Figure 3:
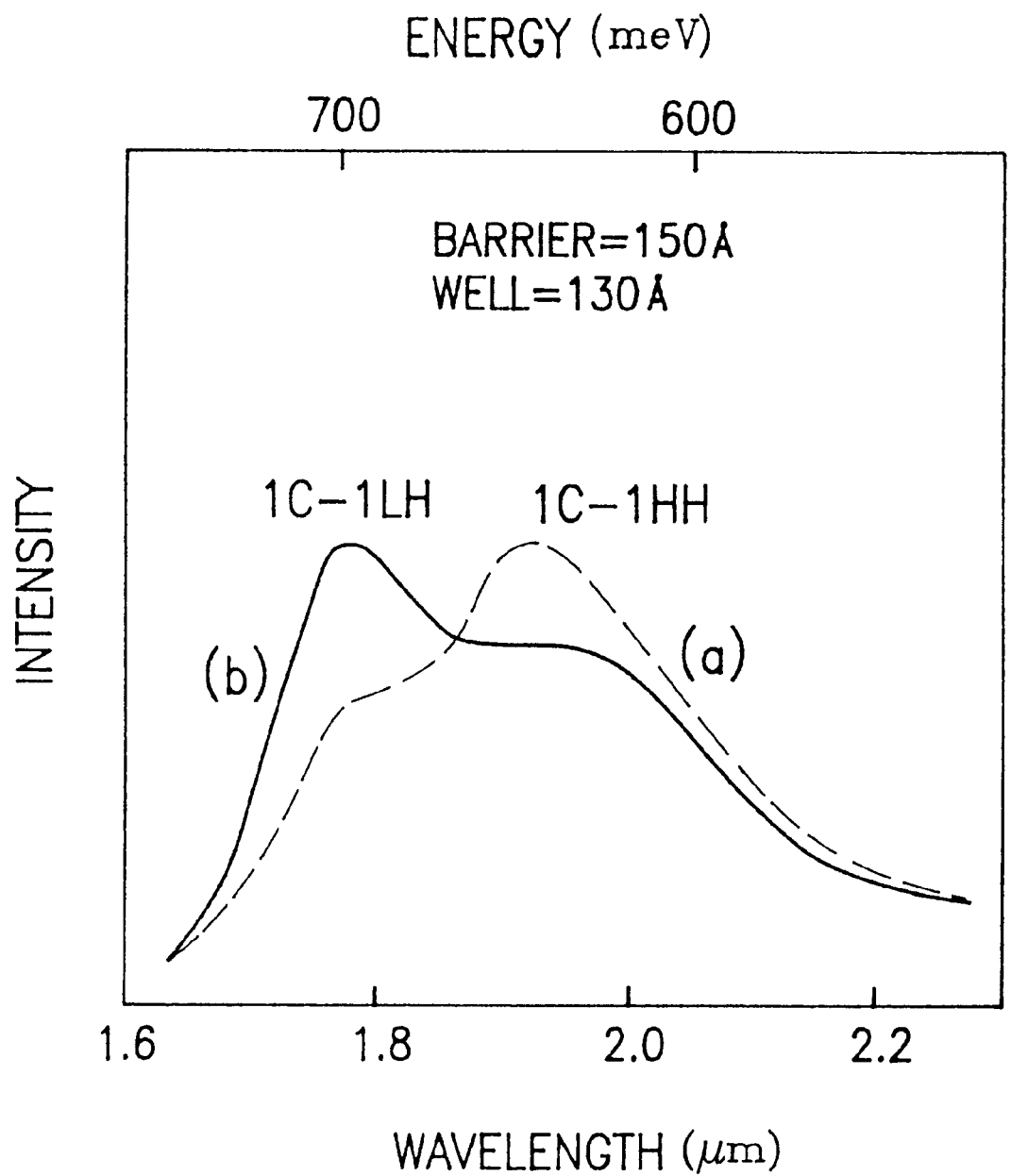
FIG. 3 is a photoresponse plot of intensity (abs.unit) vs. wavelength($\mu$m).

The present invention, by varying the external bias, allows the photodiode to absorb light of different wavelengths. Referring to FIG. 3, when the reverse bias changes from near zero volt to 0.1 volt, the absorbed wavelength also changes, from 1.93 $\mu$m to 1.77 $\mu$m.

While the above is a complete description of the preferred embodiment of the invention, various alternatives, modifications, and equivalents may be used. Therefore, the above description should not be taken as limiting the scope of the invention which is defined by the appended claims.

What is claimed is:

1. A two-mode InGaSb/GaSb strained-layer superlattice infrared photodetector, comprising:

an ohmic contact of a first conductivity type;

a GaSb layer of the first conductivity type overlaying said ohmic contact;

a plurality of InGaSb/GaSb strained-layer superlattices overlaying said GaSb layer of the first conductivity type;

a GaSb layer of a second conductivity type overlaying said plurality of InGaSb/GaSb strained-layer superlattices;

an ohmic contact of the second conductivity type overlaying said GaSb layer of the second conductivity type.

2. The two-mode InGaSb/GaSb strained-lattice superlattice infrared photodetector as claimed in claim 1, wherein said first conductivity type is N-type and said second conductivity type is P-type.

3. The two-mode InGaSb/GaSb strained-layer superlattice infrared photodetector as claimed in claim 1, wherein said first conductivity type is P-type and said second conductivity is N-type.

4. The two-mode InGaSb/GaSb strained-layer superlattice infrared photodetector as claimed in claim 1, wherein a thickness of each InGaSb layer of said plurality of InGaSb/GaSb strained-layer superlattices is about 130 Å and a thickness of each GaSb layer is about 150 Å.

5. The two-mode InGaSb/GaSb strained-layer superlattice infrared photodetector as claimed in claim 1, wherein a total number of layers of said plurality of InGaSb/GaSb strained-layer superlattices is about 10.

* * * * *